(12) United States Patent
Li et al.

(10) Patent No.: US 12,372,956 B2
(45) Date of Patent: Jul. 29, 2025

(54) RECOMMENDED METHOD FOR REPLACING EQUIPMENT AND ELECTRONIC DEVICE

(71) Applicant: Wistron Corporation, New Taipei (TW)

(72) Inventors: Chun-Hsien Li, New Taipei (TW); Chia-Chiung Liu, New Taipei (TW)

(73) Assignee: Wistron Corporation, New Taipei (TW)

( * ) Notice: Subject to any disclaimer, the term of this patent is extended or adjusted under 35 U.S.C. 154(b) by 372 days.

(21) Appl. No.: 17/993,830

(22) Filed: Nov. 23, 2022

(65) Prior Publication Data
US 2024/0077864 A1    Mar. 7, 2024

(30) Foreign Application Priority Data
Sep. 1, 2022   (TW) .................................. 111133248

(51) Int. Cl.
  *G05B 23/02* (2006.01)
  *G01R 29/08* (2006.01)
  *G01R 31/56* (2020.01)

(52) U.S. Cl.
  CPC ..... *G05B 23/0254* (2013.01); *G01R 29/0892* (2013.01); *G01R 31/56* (2020.01)

(58) Field of Classification Search
  CPC ............ G05B 23/0254; G05B 23/0294; G01R 29/0892; G01R 31/56; G01R 31/2837;
  (Continued)

(56) References Cited

U.S. PATENT DOCUMENTS 10,928,797 B2   2/2021  Hu et al.
11,334,135 B1 * 5/2022  Wang ..................... G06F 1/263
(Continued)

FOREIGN PATENT DOCUMENTS

DE    102011054435    4/2012
EP        1362618    11/2003
(Continued)

OTHER PUBLICATIONS

"Office Action of Taiwan Counterpart Application", issued on Apr. 24, 2023, p. 1-p. 8.

*Primary Examiner* — Mohammad K Islam
(74) *Attorney, Agent, or Firm* — JCIPRNET

(57) ABSTRACT

The disclosure provides a recommended method for replacing equipment and an electronic device. A plurality of reference electricity consumptions of an equipment are estimated by using an electricity consumption prediction model based on equipment operation information of the equipment in a plurality of unit periods. A plurality of actual electricity consumptions of the equipment in the multiple unit periods are obtained. An abnormal electricity consumption time interval is determined by comparing the actual electricity consumptions with the reference electricity consumptions. A replacement index and an equipment energy efficiency of the equipment in the abnormal electricity consumption time interval are determined according to the equipment operation information of the equipment in the abnormal electricity consumption time interval. In response to determining that the replacement index and the equipment energy efficiency meet a replacement condition, a recommended equipment list including at least one recommended equipment is provided.

18 Claims, 8 Drawing Sheets

(58) Field of Classification Search
CPC ..... G06F 16/9535; G06F 30/20; G06Q 10/04; G06Q 50/06
See application file for complete search history.

(56) References Cited

U.S. PATENT DOCUMENTS

| | | | |
|---|---|---|---|
| 2010/0305890 A1* | 12/2010 | Huang | H01M 10/488 |
| | | | 702/62 |
| 2016/0097556 A1* | 4/2016 | Seo | F24F 11/30 |
| | | | 700/276 |
| 2019/0163154 A1 | 5/2019 | Liang et al. | |
| 2019/0302713 A1* | 10/2019 | Chang | G06F 11/2263 |
| 2020/0174437 A1 | 6/2020 | Hu et al. | |
| 2021/0123771 A1* | 4/2021 | Vega | H04Q 9/00 |

FOREIGN PATENT DOCUMENTS

| | | |
|---|---|---|
| FR | 3060819 | 6/2018 |
| TW | 201926212 | 7/2019 |
| TW | 202020795 | 6/2020 |

\* cited by examiner

RECOMMENDED METHOD FOR REPLACING EQUIPMENT AND ELECTRONIC DEVICE

CROSS-REFERENCE TO RELATED APPLICATION

This application claims the priority benefit of Taiwan application serial no. 111133248, filed on Sep. 1, 2022. The entirety of the above-mentioned patent application is hereby incorporated by reference herein and made a part of this specification.

BACKGROUND

Technical Field

The disclosure relates to an energy conservation method, and in particular relates to a recommended method for replacing equipment and an electronic device.

Description of Related Art

With the increasing importance of environmental protection issues of greenhouse gas reduction, energy conservation and carbon reduction, energy conservation has become one of the key developments today. If we can effectively find the cause for wasting electricity and provide suitable energy conservation methods, it not only contributes to environmental protection, but also greatly benefits the cost and profit of the factory.

Equipment require electricity to function. As the operating time increases, the energy efficiency of the equipment may gradually decrease due to the wear and tear of components or various other reasons. That is, equipment with low energy efficiency need to consume more electricity to achieve their operating goals, or even fail to function properly, resulting in wasted electricity. Generally speaking, for equipment with low energy efficiency, relevant measures for equipment replacement are required. However, it is often difficult for managing personnel to detect and deal with the issue immediately, resulting in higher electricity consumption and energy costs.

SUMMARY

In view of this, the disclosure provides a recommended method for replacing equipment and an electronic device, which may be used to solve the aforementioned technical issues.

An embodiment of the disclosure provides a recommended method for replacing equipment, which includes the following operations. Multiple reference electricity consumptions of an equipment are estimated by using an electricity consumption prediction model based on equipment operation information of the equipment in multiple unit periods. Multiple actual electricity consumptions of the equipment in the multiple unit periods are obtained. An abnormal electricity consumption time interval is determined by comparing the actual electricity consumptions with the reference electricity consumptions. A replacement index and an equipment energy efficiency of the equipment in the abnormal electricity consumption time interval are determined according to the equipment operation information of the equipment in the abnormal electricity consumption time interval. In response to determining that the replacement index and the energy efficiency of the equipment meet a replacement condition, a recommended equipment list including at least one recommended equipment is provided.

An embodiment of the disclosure provides an electronic device including a display, a storage circuit, and a processor. The storage circuit stores multiple instructions. The processor, coupled to the display and the storage circuit, accesses the instructions and is configured to perform the following operations. Multiple reference electricity consumptions of an equipment are estimated by using an electricity consumption prediction model based on equipment operation information of the equipment in multiple unit periods. Multiple actual electricity consumptions of the equipment in the multiple unit periods are obtained. An abnormal electricity consumption time interval is determined by comparing the actual electricity consumptions with the reference electricity consumptions. A replacement index and an equipment energy efficiency of the equipment in the abnormal electricity consumption time interval are determined according to the equipment operation information of the equipment in the abnormal electricity consumption time interval. In response to determining that the replacement index and the equipment energy efficiency meet a replacement condition, a recommended equipment list including at least one recommended equipment is provided through the display.

In order to make the aforementioned and other features and advantages of the disclosure comprehensible, embodiments accompanied with drawings are described in detail below.

DETAILED DESCRIPTION OF DISCLOSED EMBODIMENTS

A portion of the embodiments of the disclosure will be described in detail with reference to the accompanying drawings. Element symbol referenced in the following description will be regarded as the same or similar element when the same element symbol appears in different drawings. These examples are only a portion of the disclosure and do not disclose all possible embodiments of the disclosure.

More precisely, these embodiments are only examples of the equipment and method within the scope of the patent application of the disclosure.

Figure 1:
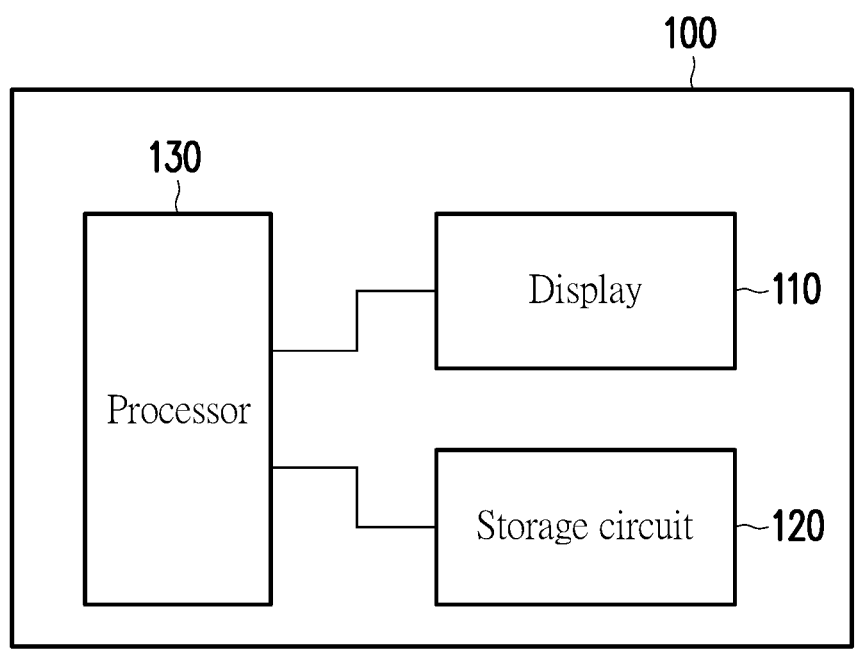
FIG. 1 is a schematic diagram of an electronic device according to an embodiment of the disclosure.

Referring to FIG. 1, which is a schematic diagram of an electronic device according to an embodiment of the disclosure. In different embodiments, the electronic device 100 is, for example, a computer device with computing capability, such as a notebook computer, a desktop computer, a server, and a workstation, but not limited thereto. The electronic device 100 may include a display 110, a storage circuit 120, and a processor 130.

The display 110 is, for example, various types of displays, such as a liquid crystal display (LCD), a light emitting diode (LED) display, and an organic light emitting diode (OLED) built in the electronic device 100, but not limited thereto. In other embodiments, the display 110 may also be any display device externally connected to the electronic device 100.

The storage circuit 120 is, for example, any type of fixed or removable random access memory (RAM), read-only memory (ROM), flash memory (Flash memory), a hard disk or other similar devices or a combination of these devices, and may be configured to record multiple instructions, codes, or software modules.

The processor 130 is, for example, a central processing unit (CPU), an application processor (AP), or other programmable general-purpose or special-purpose microprocessor, a digital signal processor (DSP), an image signal processor (ISP), a graphics processing unit (GPU) or other similar devices, integrated circuits, and combinations thereof. The processor 130 may access and perform the software modules recorded in the storage circuit 120, so as to implement the recommended method for replacing the equipment in the embodiment of the disclosure. The aforementioned software modules may be construed broadly to mean instructions, instruction sets, codes, program codes, programs, applications, software suites, threads, procedures, functions, etc., no matter whether they're referred to as software, firmware, intermediate software, microcode, hardware description language, or others.

In the embodiment of the disclosure, the equipment may be various machine equipment in a factory, such as production equipment, air compression equipment, or air conditioning equipment, etc. The equipment operation information of an equipment may include electricity consumption data, equipment status data, or equipment output data, etc. The equipment operation information of the equipment may be obtained by sensing with sensors or measuring instruments. The sensors or measuring instruments may include electricity meters, thermometers, hygrometers, pressure meters, etc., which are not limited in the disclosure. Alternatively, the equipment operation information of the equipment may be obtained from the product production plan or the factory production log recorded in the storage circuit 120.

In the embodiment of the disclosure, the processor 130 may establish an electricity consumption prediction model of the equipment according to the historical equipment operation information of the equipment, and the electricity consumption prediction model trained based on the machine learning algorithm may be recorded in the storage circuit 120. That is, the electricity consumption prediction model is a prediction model created by the processor 130 after performing machine learning or statistical calculation according to the training data set (e.g., the characteristic variables obtained from the equipment operation information of the equipment, the product production plan, or the factory production log in a historical period) to estimate the reference electricity consumption of the equipment. Correspondingly, the reference electricity consumption is a predicted value predicted based on the relationship between the electricity consumption of the equipment and the operation data of the equipment in a historical period.

Specifically, the reference electricity consumption estimated by the electricity consumption prediction model established based on the past historical information and the training data set may serve as an electricity consumption evaluation reference. In some embodiments, the processor 130 may determine whether the equipment needs to be replaced according to the reference electricity consumption output by the electricity consumption prediction model and the actual electricity consumption of the equipment, so that the factory management may deal with the situation immediately. Furthermore, in some embodiments, the processor 130 may compare the reference electricity consumption output by the electricity consumption prediction model and the actual electricity consumption of the equipment to determine the abnormal electricity consumption time interval of the equipment, and determine whether the equipment needs to be replaced according to the equipment operation information and the electricity consumption information of the equipment in the abnormal electricity consumption time interval. In some embodiments, the processor 130 may provide a recommended equipment list for the equipment that needs to be replaced, so that the factory management may use the recommended equipment in the recommended equipment list to replace the equipment that needs to be replaced.

Figure 2:
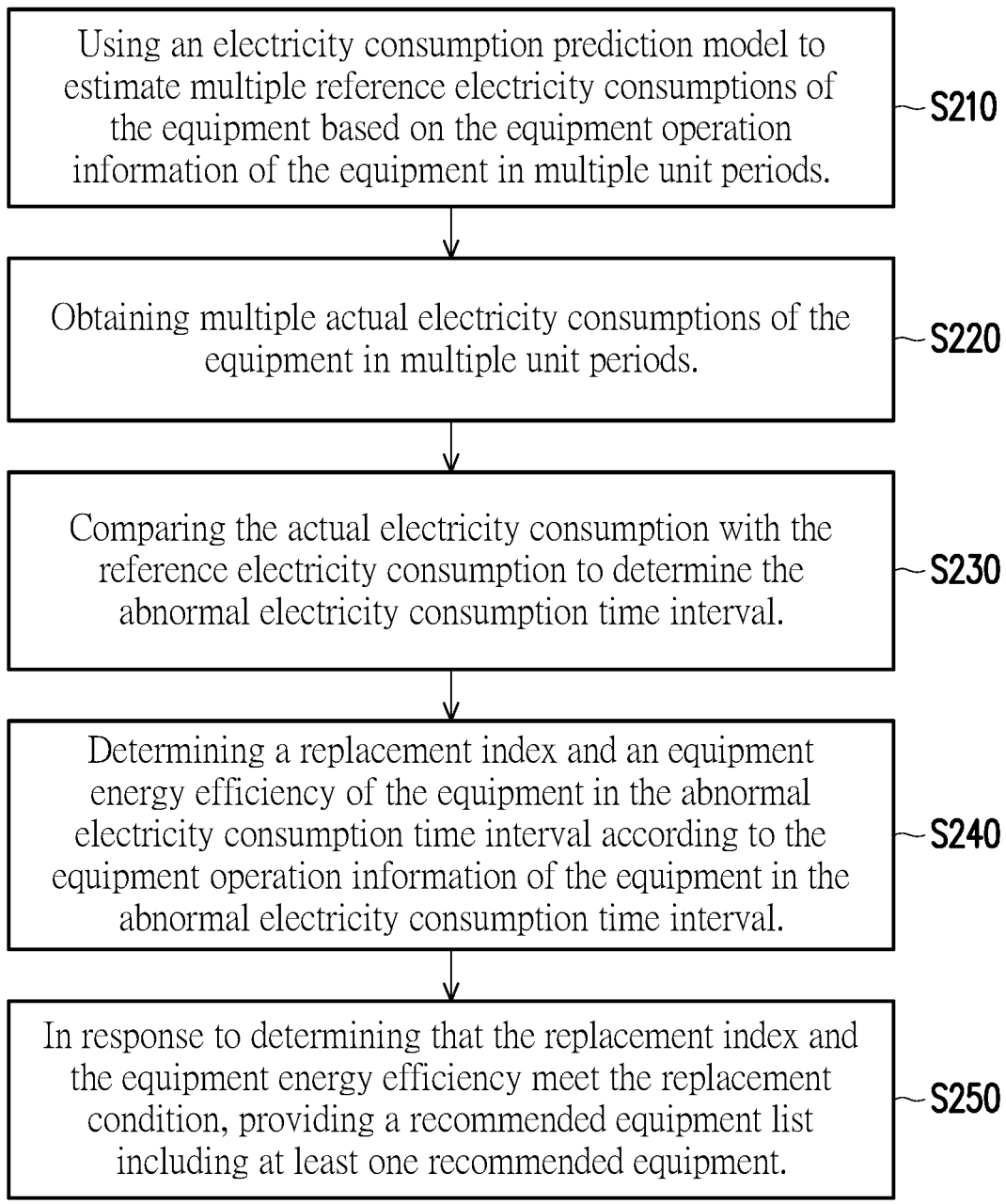
FIG. 2 is a flowchart of a recommended method for replacing equipment according to an embodiment of the disclosure.

In detail, FIG. 2 is a flowchart of a recommended method for replacing equipment according to an embodiment of the disclosure. Referring to FIG. 1 and FIG. 2, the method of this embodiment is suitable for the electronic device 100 in the aforementioned embodiment, and the following in combination with various elements in the electronic device 100 describes the detailed steps of the recommended method for replacing the equipment of this embodiment.

In step S210, the processor 130 uses an electricity consumption prediction model to estimate multiple reference electricity consumptions of the equipment based on the equipment operation information of the equipment in multiple unit periods. The time length of a unit period may be one week, one day, one hour, or one minute, etc., which is not limited in the disclosure. However, in order to clearly illustrate the disclosure, the following embodiments are continued to be described by taking the time length of a unit period as one hour as an example. The processor 130 may use the historical equipment operation information of multiple past unit periods before a specific time point as training data to establish an electricity consumption prediction model, and according to the electricity consumption prediction model and the equipment operation information of multiple unit periods after the specific time point, multiple reference electricity consumptions respectively corresponding to multiple unit periods are predicted.

For example, the processor 130 may establish an electricity consumption prediction model according to the historical equipment operation information of a certain equipment in January. After the end of January, the processor 130 may use the electricity consumption prediction model to estimate the hourly reference electricity consumption of the equipment according to the hourly equipment operation information on February 1. In detail, the processor 130 may extract multiple characteristic variables from the hourly equipment operation information on February 1, and input these characteristic variables into the electricity consumption prediction model, to drive the electricity consumption prediction model to output the hourly reference electricity consumption corresponding to February 1. The aforementioned characteristic variables are determined according to the type of equipment. For example, assuming that the equipment is an air compression equipment, the characteristic variables may include exhaust volume, equipment pressure, or machine temperature, etc. In other words, the processor 130 may establish a corresponding electricity consumption prediction model for each different type of equipment.

In step S220, the processor 130 obtains multiple actual electricity consumptions of the equipment in multiple unit periods. For example, the processor 130 may obtain the hourly actual electricity consumption of the equipment. In some embodiments, the actual electricity consumption of the equipment may be provided by the electricity meter to the processor 130 or the managing personnel may input the actual electricity consumption measured by the electricity meter to the electronic device 100.

In step S230, the processor 130 compares the actual electricity consumption with the reference electricity consumption to determine the abnormal electricity consumption time interval. Specifically, since the electricity consumption prediction model is established based on the historical equipment operation information when the equipment is in a good state, the reference electricity consumption estimated by the electricity consumption prediction model may serve as an electricity consumption evaluation reference. If the actual electricity consumption of the equipment is continuously or frequently greater than the reference electricity consumption estimated by the electricity consumption prediction model, it means that the equipment needs to consume more electricity to maintain operation. It may be seen that when a certain equipment needs to consume too much electricity to maintain operation, the factory management may consider using backup equipment or new equipment to replace the equipment, so as to avoid a substantial increase in the electricity cost of the factory. In other words, by determining whether the actual electricity consumption of the equipment is greater than the reference electricity consumption, the processor 130 may detect the abnormal electricity consumption time interval of the equipment.

In addition, in some embodiments, the processor 130 may display the reference electricity consumption and the actual electricity consumption on an operation interface through a graph through the display 110. In some embodiments, the aforementioned graph may include a line graph, and the line graph includes the predicted reference line and the actual electricity consumption line. The aforementioned predicted reference line includes reference electricity consumption corresponding to multiple unit periods, and the actual electricity consumption line at least includes actual electricity consumption corresponding to the unit periods. In addition, in other embodiments, the aforementioned graph may also be a cylindrical bar graph, a vertical bar graph, a horizontal bar graph, etc. Alternatively, in other embodiments, the processor 130 may also use a table to present the reference electricity consumption and the actual electricity consumption in the operation interface.

Figure 3:
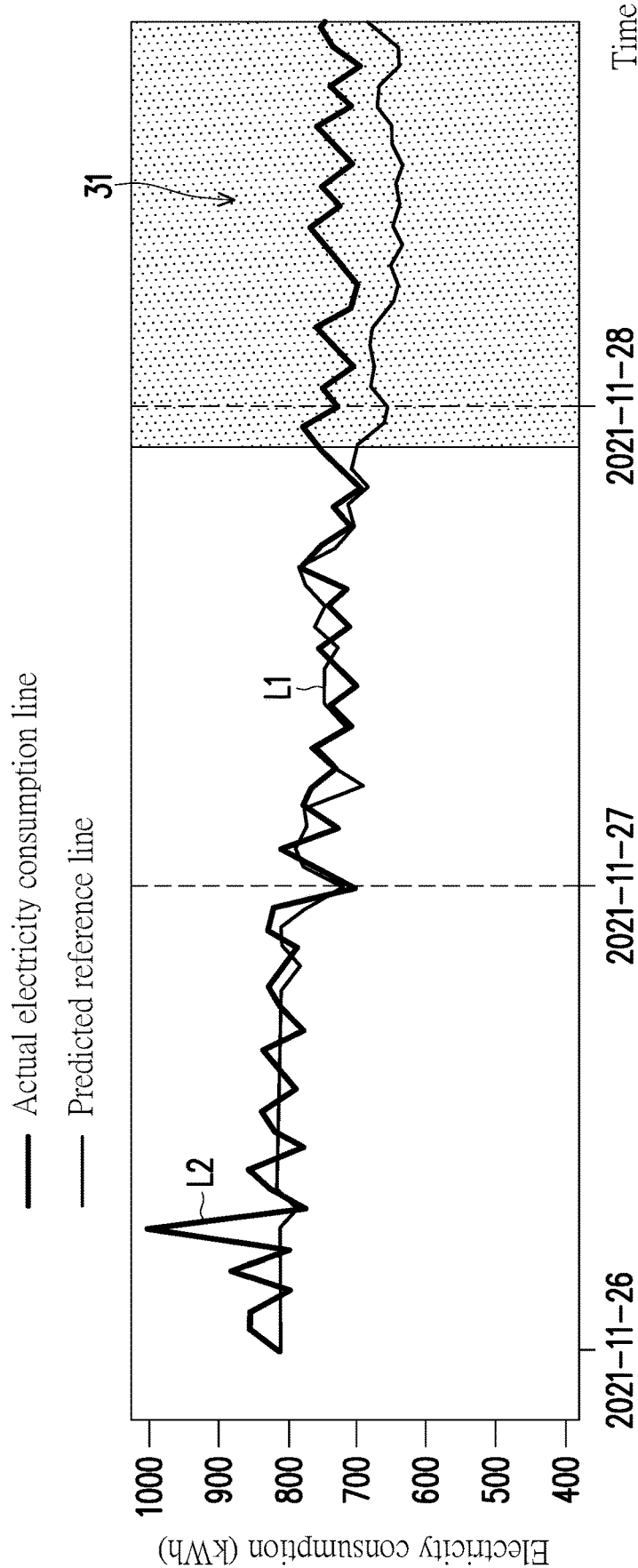
FIG. 3 is a schematic diagram of multiple reference electricity consumptions and multiple actual electricity consumptions according to an embodiment of the disclosure.

For example, referring to FIG. 3, which is a schematic diagram of multiple reference electricity consumptions and multiple actual electricity consumptions according to an embodiment of the disclosure. The processor 130 may display a line graph 31 through the display 110, and the line graph 31 may present the reference electricity consumption and the actual electricity consumption of a certain equipment corresponding to multiple unit periods. The line graph 31 includes a predicted reference line L1 and an actual electricity consumption line L2. The processor 130 may connect the reference electricity consumption corresponding to each unit period as the predicted reference line L1 according to the sequence of the unit periods, that is, connect the hourly reference electricity consumptions as the predicted reference line L1. Similarly, the processor 130 may connect the actual electricity consumption corresponding to each unit period as the actual electricity consumption line L2 according to the sequence of the unit periods, that is, connect the hourly actual electricity consumptions as the actual electricity consumption line L2. In this way, the factory management may quickly understand the difference between the reference electricity consumption in each unit period output by the electricity consumption prediction model and the actual electricity consumption in each unit period by viewing the line graph 31 displayed on the display 110. It may be roughly determined whether the electricity consumption of the equipment meets the expectations or whether there is an abnormal situation. For example, referring to FIG. 3, the processor 130 may find out that the actual electricity consumption line L2 has been significantly higher than the predicted reference line L1 during the whole day on November 28, which means that the electricity consumption has always exceeded expectations, thereby the processor 130 may identify the abnormal electricity consumption time interval.

In step S240, the processor 130 determines a replacement index and an equipment energy efficiency of the equipment in the abnormal electricity consumption time interval according to the equipment operation information of the equipment in the abnormal electricity consumption time interval. Specifically, in response to the processor 130 detecting the abnormal electricity consumption time interval of the equipment according to the actual electricity consumption and the reference electricity consumption, the processor 130 determines the replacement index and the equipment energy efficiency of the equipment in the abnormal electricity consumption time interval according to the equipment operation information in the abnormal electricity consumption time interval. In some embodiments, the equipment energy efficiency and replacement index of the equipment are parameter values determined according to the equipment operation information, the electricity consumption, and the equipment specifications. The equipment energy efficiency of the equipment may represent the equipment operating efficiency per unit of electricity consumption. The replacement index of the equipment may represent the replacement benefit caused by the replacement of the equipment.

In step S250, in response to determining that the replacement index and the equipment energy efficiency meet the replacement condition, the processor 130 provides a recommended equipment list including at least one recommended equipment through the display 110. Specifically, after detecting the abnormal electricity consumption time interval of a certain equipment "machine A", if the replacement index and equipment energy efficiency of the "machine A" within the abnormal electricity consumption time interval meet the replacement condition, the processor 130 may automatically determine that the "machine A" needs to be replaced, and accordingly provides a recommended equipment list for the "machine A". The aforementioned recommended equipment list includes at least one recommended equipment, so that the factory management may select a recommended equipment for replacing "machine A" from the recommended equipment list. That is, the processor 130 may automatically and instantly identify the equipment that needs to be replaced, and provide a recommended equipment list including the recommended equipment for the management personnel to refer to. In this way, factory management may instantly find out which machines have abnormal electricity consumption and need to be replaced, and deal with them appropriately according to the recommended equipment list, thereby avoiding energy waste and conserving electricity costs.

Figure 4:
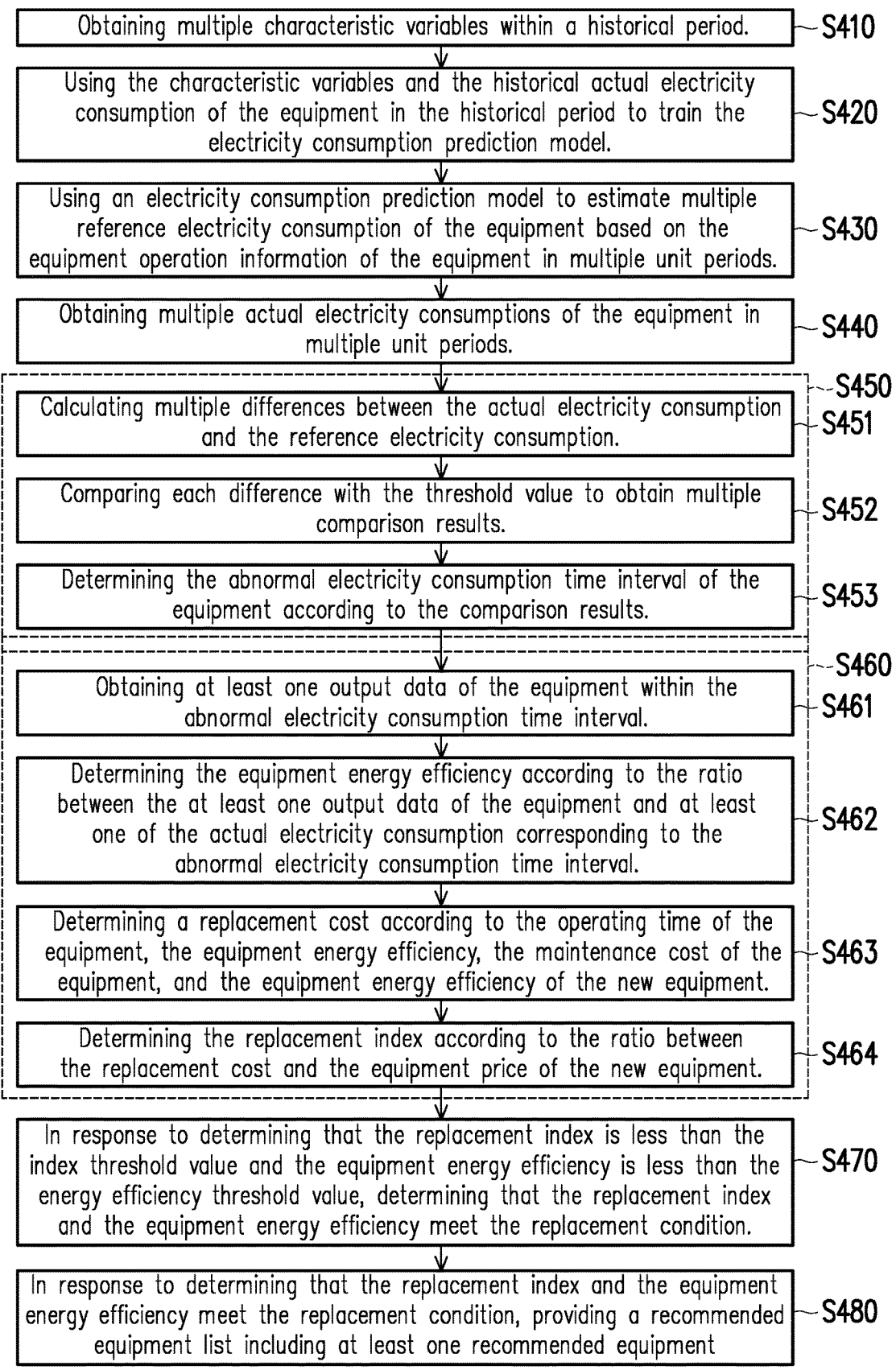
FIG. 4 is a flowchart of a recommended method for replacing equipment according to an embodiment of the disclosure.

FIG. 4 is a flowchart of a recommended method for replacing equipment according to an embodiment of the disclosure. Referring to FIG. 1 and FIG. 4, the method of this embodiment is suitable for the electronic device 100 in the aforementioned embodiment, and the following in combination with various elements in the electronic device 100 describes the detailed steps of the recommended method for replacing the equipment of this embodiment.

In step S410, the processor 130 obtains multiple characteristic variables within a historical period. Specifically, after determining to establish an electricity consumption prediction model for a certain equipment, the processor 130 may collect historical equipment operation information for the equipment in a historical period (i.e., multiple unit periods in the past). The historical equipment operation information may include multiple historical actual electricity consumption and multiple characteristic variables within a historical period. In some embodiments, the processor 130 may obtain some characteristic variables from sensors or measuring instruments disposed on the equipment, and may also receive some characteristic variables input by the factory management. The aforementioned characteristic variables are determined according to the type of equipment. For example, assuming that the equipment is an air compression equipment, the characteristic variables may include exhaust volume, equipment pressure, or machine temperature, etc. Assuming the equipment is a production equipment, the characteristic variables may include the production volume of semi-finished or finished products, human resources, the number of equipment turned on, etc. Assuming that the equipment is an air conditioning equipment, the characteristic variables may include ambient temperature, temperature change, humidity, etc. In other words, the processor 130 may establish a corresponding electricity consumption prediction model for each different type of equipment.

In step S420, the processor 130 uses the characteristic variables and the historical actual electricity consumption of the equipment in the historical period to train the electricity consumption prediction model. These model types may include traditional statistical models such as a linear regression model or a least absolute shrinkage and selection operator (LASSO) model. Alternatively, these model types may include machine learning models such as a support vector machine (SVM) model or a random forest model. Alternatively, these model types may include deep learning models, such as a recurrent neural network (RNN) model or a long short-term memory (LSTM) model. Alternatively, these model types may include integrated models, such as a stacking model or a weighted sum model. However, the disclosure does not limit the model type, which may be set according to practical applications.

In some embodiments, the processor 130 uses different model algorithms to establish multiple prediction models respectively corresponding to different model types. Furthermore, the processor 130 may test multiple prediction models by using the model testing data, and select an electricity consumption prediction model from the prediction models. Specifically, in the model testing stage, the processor 130 may obtain characteristic variables for testing the prediction models in another historical period according to the model testing data. The processor 130 respectively inputs the characteristic variables used for testing into the corresponding prediction models to obtain the output data of the prediction models, to evaluate the pros and cons of these prediction models according to the deviation between the testing output data of these prediction models and the corresponding historical actual electricity consumption. In some embodiments, the processor 130 may compare the model metrics of each prediction model, and select the prediction model with the smallest model metric as the final electricity consumption prediction model. The aforementioned model metric is, for example, mean absolute error (MAE) or mean absolute percentage error (MAPE), but the disclosure is not limited thereto.

In step S430, the processor 130 uses an electricity consumption prediction model to estimate multiple reference electricity consumption of the equipment based on the equipment operation information of the equipment in multiple unit periods. It may be seen that, based on the characteristic variables determined during the model establishment period, the processor 130 may obtain multiple characteristic variables from the equipment operation information in multiple unit periods, and input the characteristic variables corresponding to the unit periods into the electricity consumption prediction model to estimate the reference electricity consumption in multiple unit periods. For example, the processor 130 may input the hourly exhaust volume, equipment pressure, or machine temperature of a certain air compression equipment into the electricity consumption prediction model to estimate the hourly reference electricity consumption. In step S440, the processor 130 obtains multiple actual electricity consumptions of the equipment in multiple unit periods. The detailed implementation of step S430 to step S440 has been clearly described in step S210 to step S220 in the embodiment of FIG. 2, and are not repeated herein.

Next, in step S450, the processor 130 compares the actual electricity consumption with the reference electricity consumption to determine the abnormal electricity consumption time interval. In the embodiment of FIG. 4, step S450 may be implemented as step S451 to step S453.

In step S451, the processor 130 calculates multiple differences between the actual electricity consumption and the reference electricity consumption. Specifically, the processor 130 obtains a difference by subtracting the corresponding reference electricity consumption from the hourly actual electricity consumption. For example, the processor 130 may generate the reference electricity consumption between 2 PM and 3 PM according to the equipment operation information between 2 PM and 3 PM, and then the processor 130 may obtain a difference by subtracting the reference electricity consumption between 2 PM and 3 PM from the actual electricity consumption between 2 PM and 3 PM. That is, the processor 130 may calculate a difference every one hour. However, in other embodiments, the processor 130 may also calculate a difference every 30 minutes, two hours, six hours, eight hours, one day, or other time intervals.

In step S452, the processor 130 compares each difference with the threshold value to obtain multiple comparison results. In some embodiments, the processor 130 determines whether each difference is greater than a threshold value in sequence over time, and obtains a comparison result corresponding to each hour. It should be noted that if the difference is greater than the threshold value, it means that the equipment may have abnormal electricity consumption.

In step S453, the processor 130 determines the abnormal electricity consumption time interval of the equipment according to the comparison results. Specifically, by determining whether these differences are continuously greater than the threshold value, the processor 130 may identify the abnormal electricity consumption time interval of the equipment. Alternatively, the processor 130 may identify the abnormal electricity consumption time interval of the equipment by determining whether the number of times that these differences are greater than the threshold value within the preset length period has reached the preset number of times. Alternatively, the processor 130 may identify multiple candidate time periods according to the differences corresponding to each hour according to the aforementioned different determining mechanisms, and determine the abnormal electricity consumption time interval of the equipment according to the union or intersection of these candidate time periods.

In some embodiments, in response to the number of differences greater than the threshold value is greater than a preset number within the preset length period, the processor 130 identifies the unit periods corresponding to the differences greater than the threshold value within the preset length period as the first candidate period of the abnormal electricity consumption time interval. In response to the differences corresponding to multiple consecutive time periods are all greater than the threshold value, the processor 130 identifies the unit periods corresponding to the differences greater than the threshold value as the second candidate time period of the abnormal electricity consumption time interval. Finally, the processor 130 determines the abnormal electricity consumption time interval according to the first candidate period and the second candidate period.

Figure 5:
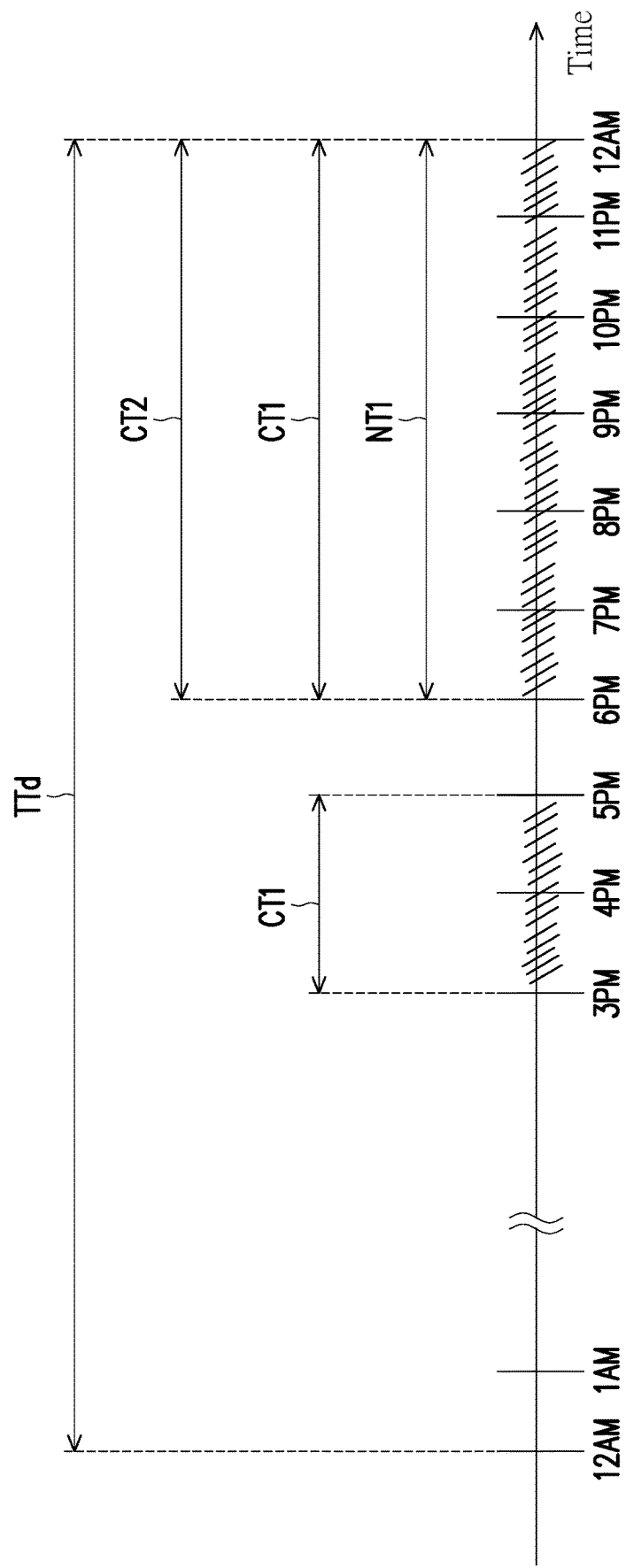
FIG. 5 is a schematic diagram determining an abnormal electricity consumption time interval of an equipment according to an embodiment of the disclosure.

For example, FIG. 5 is a schematic diagram determining an abnormal electricity consumption time interval of an equipment according to an embodiment of the disclosure. Referring to FIG. 5, the processor 130 generates a difference corresponding to each hour by comparing the hourly actual electricity consumption with the reference electricity consumption. The processor 130 compares these differences to a threshold value and determines that the two differences between 3 PM and 5 PM are greater than the threshold value and the six differences between 6 PM and 12 AM are greater than the threshold value.

It is assumed that the first determining mechanism is to determine whether the number of differences greater than the threshold value within the preset length period TTd is more than the preset number, in which the preset length period TTd is one day and the preset number is, for example, 6. Since the number of differences greater than the threshold value within the preset length period TTd is at least 8, which is more than the preset number 6, the processor 130 may identify 3 PM to 5 PM and 6 PM to 12 AM as the first candidate period CT1 of the abnormal electricity consumption time interval.

It is assumed that the second determining mechanism is to determine whether the differences corresponding to M consecutive time periods are all greater than the threshold value, in which M is, for example, 6. Since the six differences from 6 PM to 12 AM are continuously greater than the threshold value, the processor 130 may identify 6 PM to 12 AM as the second candidate period CT2 of the abnormal electricity consumption time interval.

Afterwards, in the example of FIG. 5, the processor 130 may take the intersection of the first candidate period CT1 and the second candidate period CT2 to finally determine the abnormal electricity consumption time interval NT1 of the equipment. That is, the processor 130 determines that the abnormal electricity consumption time interval NT1 may be a suitable time to replace the equipment.

In step S460, the processor 130 determines a replacement index and an equipment energy efficiency in the abnormal electricity consumption time interval according to the equipment operation information of the equipment in the abnormal electricity consumption time interval. In the embodiment of FIG. 4, step S460 may be implemented as step S461 to step S464.

In step S461, the processor 130 obtains at least one output data of the equipment within the abnormal electricity consumption time interval. In step S462, the processor 130 determines the equipment energy efficiency according to the ratio between the at least one output data of the equipment and at least one of the actual electricity consumption corresponding to the abnormal electricity consumption time interval. In some embodiments, the output data may be generated by sensors or measuring instruments on the equipment. In some embodiments, the output data may be generated by sensors or measuring instruments disposed at the factory. In some embodiments, the output data may be determined according to data within the product production plan.

In some embodiments, the equipment energy efficiency of the equipment is a parameter value determined according to the output data and the electricity consumption of the equipment, and the aforementioned electricity consumption may be the actual electricity consumption. The output data is determined according to the type of equipment. For example, assuming that the equipment is an air compression equipment, the output data may include exhaust volume, equipment pressure, or machine temperature, etc. For example, the processor 130 may calculate the unit electricity consumption of the air compression equipment to generate the exhaust volume to obtain the equipment energy efficiency of the air compression equipment. For example, the equipment energy efficiency of an air compression equipment may be the hourly exhaust volume divided by the actual electricity consumption for that hour. Assuming that the equipment is a production equipment, the output data may include product production volume, human resources, or the number of equipment turned on, etc. For example, the processor 130 may calculate the unit electricity consumption of the production equipment to generate the product production volume to obtain the equipment energy efficiency of the production equipment. Assuming that the equipment is an air conditioning equipment, the output data may include ambient temperature or humidity, etc. The processor 130 may calculate the unit electricity consumption of the air conditioning equipment which causes the temperature difference between indoor and outdoor to obtain the equipment energy efficiency of the air conditioning equipment.

It should be noted that the processor 130 may determine each hourly equipment energy efficiency according to each hourly output data and each hourly actual electricity consumption in the abnormal electricity consumption time interval. Since the abnormal electricity consumption time interval may include multiple unit periods, the processor 130 may calculate the statistical value of multiple equipment energy efficiencies for multiple hours in the abnormal electricity consumption time interval, and determine whether the replacement condition is satisfied according to the statistical value of the equipment energy efficiencies. The statistical value may be a median or an average value, which is not limited in the disclosure.

In addition, in some embodiments, the processor 130 may filter affected equipment from other equipment with the same specifications according to the equipment energy efficiency within a historical period. It should be noted that, if the equipment is replaced with new equipment, the new equipment will operate at all times based on the consideration of conserving electricity consumption, which will affect the operating hours of other equipment, and thus affect the replacement benefit of the equipment replacement. Therefore, in some embodiments, the processor 130 may use the electricity consumed by the affected equipment as one of the factors in determining the replacement cost of the equipment. In some embodiments, the processor 130 may calculate the median or average value of multiple equipment energy efficiencies of an equipment in a historical period based on the historical data to obtain the estimated energy efficiency, and calculate the median or average value of multiple other equipment energy efficiencies of at least one other equipment in the historical period based on the historical data to obtain other estimated energy efficiency. The processor 130 may set other equipment having other estimated energy efficiency higher than the estimated energy efficiency as an affected equipment. For example, Table 1 shows the specifications and estimated energy efficiencies of two equipment.

TABLE 1

| Equipment number | Rated power (KW) | Rated exhaust volume (CMM) | Estimated efficiency |
|---|---|---|---|
| 6# | 750 | 100 | 6.9 |
| 4# | 750 | 100 | 7.3 |

In the example in Table 1, when calculating the replacement cost of the equipment 6 #, since the estimated energy efficiency of the other equipment 4 # is "7.3", which is higher than "6.9" of the estimated energy efficiency of the equipment 6 #, the processor 130 may consider the equipment 4 # as an affected equipment of the equipment 6 #. In some embodiments, the processor 130 may sequentially compare the equipment specifications, the estimated energy efficiencies, and the operating hours of the other equipment to filter out the affected equipment. For example, the processor 130 may first filter out some first candidate equipment according to the equipment specifications of the equipment 6 #. Next, the processor 130 compares the estimated energy efficiency of the equipment 6 # with the estimated energy efficiencies of these candidate equipment to filter out some second candidate equipment from the first candidate equipment. Then, the processor 130 may filter out the affected equipment of the equipment 6 # according to the respective operating hours of these second candidate equipment. However, in other embodiments, the processor 130 may also filter out affected equipment by referring to the operating hours of other equipment. However, the disclosure does not limit the number of affected equipment, which is determined by the filtering condition and actual requirements.

Afterwards, regardless of whether the affected equipment is filtered out, in step S463, the processor 130 determines a replacement cost according to the operating time of the equipment, the equipment energy efficiency, the maintenance cost of the equipment, and the equipment energy efficiency of the new equipment. In some embodiments, if the affected equipment is filtered out, the processor 130 determines the replacement cost according to the operating time of the equipment, the equipment energy efficiency, the maintenance cost of the equipment, the equipment energy efficiency of the new equipment, the operating time of the other equipment (i.e. the affected equipment), and the other equipment energy efficiency of the other equipment (i.e. the affected equipment). Furthermore, in some embodiments, the new equipment described above may include a first new equipment associated with the equipment and a second new equipment associated with the affected equipment. Taking Table 1 as an example, the equipment 4 # is the affected equipment of the equipment 6 #, and the new equipment used to estimate the replacement cost of the equipment 6 # may include a new equipment associated with the equipment 6 # and a new equipment associated with the equipment 4 #. The new equipment associated with the equipment 6 # and the new equipment associated with the equipment 4 # may be determined through prior evaluation. In some embodiments, the new equipment associated with the equipment 6 # may be the same or different from the new equipment associated with the equipment 4 #.

In some embodiments, the operating time of the equipment may represent the estimated operating hours of the equipment in a year. Specifically, the processor 130 may estimate the operating time of the equipment and the operating time of other equipment (i.e., the affected equipment) according to the equipment operation information collected in a time interval. For example, it is assumed that the equipment reports an exhaust volume per hour. For one equipment, the processor 130 may collect 24*30 entries of exhaust volumes in a month, among which there are N entries of exhaust volumes that are not 0. Based on this, the processor 130 may determine that the equipment operates for N hours a month, and estimate the original operating time T1 of the equipment within one year according to the formula [N/(24*30)]*7200. Similarly, the processor 130 may determine another original operating time T2 of the other equipment (i.e., the affected equipment) within one year according to a similar method. Next, the processor 130 may calculate the operating time of the equipment based on the following Formula (1).

$$\text{Operating time of the equipment} = [T1/(T1+T2)]*7200 \quad \text{Formula (1)}$$

On the other hand, by replacing the numerator of Formula (1) above with another original operating time T2 of other equipment, the processor 130 may calculate the operating time of the other equipment (i.e., the affected equipment).

In some embodiments, the processor 130 may obtain equipment information of the new equipment. Equipment information of the new equipment may include equipment specifications, equipment prices, and equipment energy efficiencies. For example, Table 2 is the equipment information of the new equipment. For example, the new equipment corresponding to the equipment 6 # and the new equipment corresponding to the equipment 4 # may be the same equipment 1 #.

TABLE 2

| New equipment number | Type of lubrication | Type of compression | Rated power | Rated exhaust volume | Equipment price | Equipment energy efficiency |
|---|---|---|---|---|---|---|
| 1# | No oil | Centrifugal | 750 | 134 | 2700000 | 10.9 |

In some embodiments, the processor 130 may obtain the maintenance cost of the equipment. For example, Table 3 shows the maintenance costs for two equipment.

TABLE 3

| Equipment number | Annual maintenance cost | Maintenance items |
|---|---|---|
| 6# | 10952 | Centrifuge air leakage, oil temperature controller replacement |
| 4# | 5267 | Check valve replacement, frequency conversion contactor replacement, dryer maintenance |

In some embodiments, the processor 130 may calculate the replacement cost of an equipment according to the following Formula (2).

$$\text{Replacement cost} = P1 \times TY1 \times EP \times \frac{EER_{new1} - EER_1}{EER_1} + P2 \times TY2 \times EP \times \frac{EER_{new2} - EER_2}{EER_2} + M1 \quad \text{Formula (2)}$$

Assuming that Formula (2) is used to calculate the replacement cost of equipment 6 #, then P1 is the rated power of the equipment 6 #; TY1 is the operating hours of the equipment 6 #; EP is the unit price of electricity; $EER_{new1}$ is the equipment energy efficiency of the new equipment associated with the equipment 6 #; $EER_{new2}$ is the equipment energy efficiency of the new equipment associated with the equipment 4 #; $EER_1$ is the equipment energy efficiency of the equipment 6 #; M1 is the maintenance cost of the equipment 6 #. Assuming that the equipment 4 # is the affected equipment to replace the equipment 6 #, then P2 is the rated power of the equipment 4 #; TY2 is the operating hours of the equipment 4 #; $EER_2$ is the equipment energy efficiency of the equipment 4 #. However, Formula (2) is only described with one affected equipment as an example, but the disclosure is not limited thereto. In other embodiments, if there are multiple affected equipment, the replacement cost needs to take into consideration the rated power, operating hours, and equipment energy efficiencies of the multiple affected equipment. Furthermore, if the new equipment of the equipment 6 # is the same as the new equipment of the equipment 4 #, then $EER_{new1}$ is the same as $EER_{new2}$.

In step S464, the processor 130 determines the replacement index according to the ratio between the replacement cost and the equipment price of the new equipment. More specifically, the processor 130 divides the equipment price of the new equipment by the replacement cost of the equipment to obtain the replacement index of the equipment. Based on this, when the replacement index of the equipment is lower, it means that the equipment needs to be replaced.

It should be noted that the processor 130 may determine an equipment energy efficiency according to each hourly output data and each hourly actual electricity consumption in the abnormal electricity consumption time interval. Since the abnormal electricity consumption time interval may include multiple unit periods, after the processor 130 calculates multiple equipment energy efficiencies for multiple hours in the abnormal electricity consumption time interval, the processor 13 may calculate multiple replacement indexes for multiple hours in the abnormal electricity consumption time interval according to the aforementioned multiple equipment energy efficiencies. Afterwards, the processor 130 may determine whether the replacement condition is satisfied according to the median or the average value of the aforementioned multiple replacement indexes.

In some embodiments, after the processor 130 determines the replacement index and the equipment energy efficiency of the equipment in the abnormal electricity consumption time interval according to the equipment operation information or output data of the equipment in the abnormal electricity consumption time interval, the processor 130 determines whether the replacement index in the abnormal electricity consumption time interval is less than an index threshold value and determines whether the equipment energy efficiency in the abnormal electricity consumption time interval is less than an energy efficiency threshold value, so as to determine whether the replacement condition is satisfied. The index threshold value and the energy efficiency threshold value may be set according to practical applications, which are not limited in the disclosure.

In step S470, in response to determining that the replacement index is less than the index threshold value and the equipment energy efficiency is less than the energy efficiency threshold value, the processor 130 determines that the replacement index and the equipment energy efficiency meet the replacement condition. In step S480, in response to determining that the replacement index and the equipment energy efficiency meet the replacement condition, the processor 130 provides a recommended equipment list including at least one recommended equipment through the display 110.

In some embodiments, the processor 130 may determine the replacement index and the equipment energy efficiency of each equipment in a general time interval according to the equipment operation information of each equipment in the factory. Based on this, the processor 130 may establish an exclusive recommended equipment list for each equipment according to the replacement index and equipment energy efficiency of each equipment in a general time interval.

Figure 6:
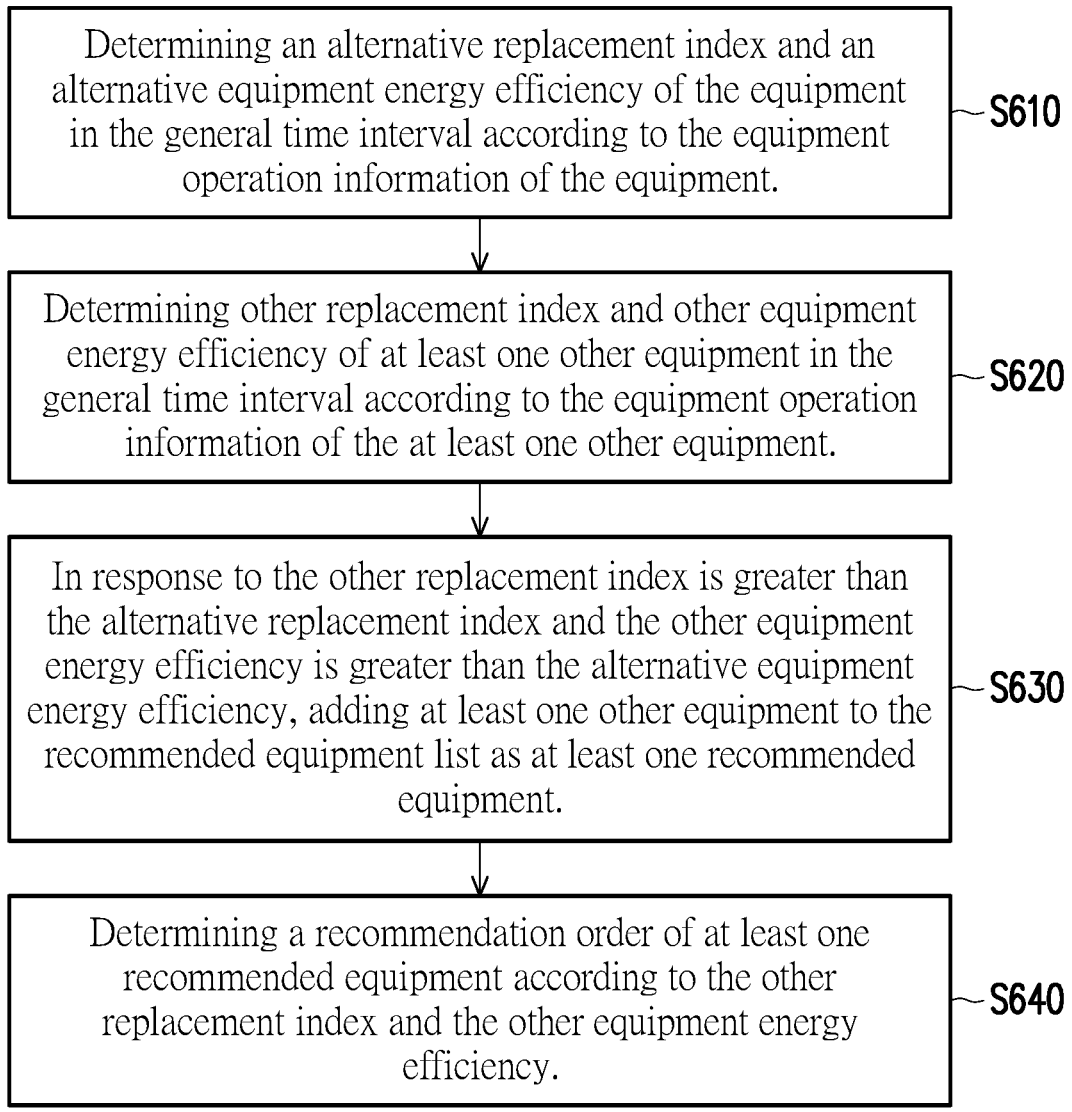
FIG. 6 is a flowchart for generating a recommended equipment list according to an embodiment of the disclosure.

Referring to FIG. 6, which is a flowchart for generating a recommended equipment list according to an embodiment of the disclosure. In step S610, the processor 130 determines an alternative replacement index and an alternative equipment energy efficiency of the equipment in the general time interval according to the equipment operation information of the equipment. Here, the calculation method of the processor 130 for calculating the alternative replacement index and the alternative equipment energy efficiency in the general time interval is similar to the calculation method of step S460 in the aforementioned embodiment. The difference is that in step S460, the equipment operation information in the abnormal time interval is obtained to calculate the replacement index and the equipment energy efficiency in the abnormal time interval. In step S610, the equipment operation information in the general time interval is obtained to calculate the alternative replacement index and the alternative equipment energy efficiency in the general time interval. That is, in step S610, the processor 130 may obtain the output data of the equipment in the general time interval, and determine the equipment energy efficiency in the general time interval according to the ratio between the output data of the equipment and the actual electricity consumption corresponding to the general time interval. Afterwards, the processor 130 may determine the alternative replacement index within the general time interval according to the operating time of the equipment, the equipment energy efficiency of the equipment in the general time interval, the maintenance cost of the equipment, the equipment energy efficiency of the new equipment, the operating time of the affected equipment, the equipment energy efficiency of the affected equipment in the general time interval, and the equipment price of the new equipment.

In step S620, the processor 130 determines other replacement index and other equipment energy efficiency of at least one other equipment in the general time interval according to the equipment operation information of the at least one other equipment. Here, the implementation of step S620 is similar to that of step S610. That is, in some embodiments, based on step S610 and step S620, the processor 130 may determine the replacement index and the equipment energy efficiency of each equipment within the general time interval according to the equipment operation information of each equipment. For example, when the recommendation list is to be generated for the equipment 6 #, the processor 130 determines the alternative replacement index and the alternative equipment energy efficiency of the equipment 6 # in the general time interval according to the equipment operation information of the equipment 6 #. In addition, the processor 130 may determine other replacement index and the equipment energy efficiency of the other equipment 4 # in the general time interval according to the equipment operation information of the other equipment 4 #.

Afterwards, in some embodiments, the processor 130 generates a recommended equipment list according to the alternative replacement index and the alternative equipment energy efficiency in the general time interval and other replacement index and other equipment energy efficiency of at least one other equipment in the general time interval. The processor 130 may compare the alternative replacement index of the equipment with the other replacement index of the other equipment in the general time interval, and compare the alternative equipment energy efficiency of the equipment with the other equipment energy efficiency of the other equipment in the general time interval, thereby filtering out the recommended equipment.

In step S630, in response to the other replacement index is greater than the alternative replacement index and the other equipment energy efficiency is greater than the alternative equipment energy efficiency, the processor 130 adds at least one other equipment to the recommended equipment list as at least one recommended equipment. For example, Table 4 shows the replacement indexes and the equipment energy efficiencies of three equipment with similar specifications in a general time interval.

TABLE 4

| Equipment number | Equipment energy efficiency (median) | Replacement index (median) |
|---|---|---|
| 6# | 6.9 | 1.02 |
| 4# | 7.3 | 1.15 |
| 3# | 7.1 | 1.05 |

In the example in Table 4, since the equipment energy efficiency (i.e., the other equipment energy efficiency) and the replacement index (i.e., the other replacement index) of the equipment 4 # are respectively greater than the equipment energy efficiency and the replacement index of the equipment 6 #, the equipment 4 # may serve as the recommended equipment of the equipment 6 #. In the same way, since the equipment energy efficiency (i.e., the other equipment energy efficiency) and the replacement index (i.e., the other replacement index) of the equipment 3 # are respectively greater than the equipment energy efficiency and the replacement index of the equipment 6 #, the equipment 3 # may serve as the recommended equipment of the equipment 6 #. In other words, the recommended equipment list exclusive to the equipment 6 # may include the equipment 4 # and the equipment 3 #.

In step S640, the processor 130 determines a recommended order of at least one recommended equipment according to the other replacement index and the other equipment energy efficiency of the recommended equipment. In some embodiments, the processor 130 may first determine the recommended order of the recommended equipment according to the other equipment energy efficiencies of the recommended equipment. If the other equipment energy efficiencies of the recommended equipment are the same, the processor 130 then determines the recommended order of the recommended equipment according to the other replacement index of the recommended equipment. For example, in the example of Table 4, since the equipment energy efficiency of the equipment 4 # is greater than the equipment energy efficiency of the equipment 3 #, the processor 130 may set the recommended order of the equipment 4 # to be the first order, and set the recommended order of the equipment 3 # to be the second order. Alternatively, in some embodiments, the processor 130 may first determine the recommended order of the recommended equipment according to a comprehensive index of the recommended equipment, where the aforementioned comprehensive index is the sum of the product of the first weight multiplied by the other equipment energy efficiency and the product of the second weight multiplied by the other replacement index. For example, in the example of Table 4, the comprehensive index of the equipment 4 # is 0.1*7.3 0.9*1.15=1.765, and the comprehensive index of the equipment 3 # is 0.1*7.1 0.9*1.05=1.655. Since the comprehensive index of the equipment 4 # is greater than the comprehensive index of the equipment 3 #, the processor 130 may set the recommended order of the equipment 4 # to be the first order, and set the recommended order of the equipment 3 # to be the second order.

In some embodiments, the recommended equipment list may further include a new equipment and the recommended order of the new equipment. That is, when the recommended equipment cannot be filtered out from other existing equipment, the recommended equipment list also includes at least one new equipment. In some embodiments, the recommended order of other existing equipment as the recommended equipment precedes the recommended order of the new equipment. For example, the recommended order of the new equipment may be the last in the recommended equipment list.

In some embodiments, the processor 130 may further calculate the replacement benefit for the recommended equipment in the recommended equipment list. In some embodiments, the replacement benefit may be the amount of cost reduced by using the recommended equipment for equipment replacement. The replacement benefit is determined according to the replacement index, the replacement cost, and the estimated number of years of the equipment. Alternatively, the replacement benefit is determined according to the replacement cost and the estimated number of years of the equipment. In some embodiments, when the recommended equipment is a new equipment, the processor 130 may calculate the replacement benefit according to the following Formula (3).

$$\begin{cases} \text{Replacement benefit} = \text{first replacement cost} \times \\ \quad (\text{estimated number of years} - \text{replacement index}), \\ \quad \text{if the estimated number of years} > \text{replacement} \\ \quad \text{index Replacement benefit} = 0, \text{ if the} \\ \quad \text{estimated number of years} \leq \text{replacement index} \end{cases} \quad \text{Formula (3)}$$

In some embodiments, when the recommended equipment is other equipment, the processor 130 may calculate the replacement benefit according to the following Formula (4).

$$\text{Replacement benefit} = \text{second replacement cost} \times \text{estimated number of years} \quad \text{Formula (4)}$$

It should be noted that the calculation method of the first replacement cost of Formula (3) is similar to the calculation method of Formula (2), which includes the equipment energy efficiency of the new equipment and the equipment energy efficiency and operating hours of the affected equipment. The calculation method of the second replacement cost of Formula (4) is shown in Formula (5).

$$\text{Second replacement cost} = \quad \text{Formula (5)}$$
$$P1 \times TY1 \times EP \times \frac{EER_3 - EER_1}{EER_1} + M1$$

Assuming that Formula (5) is used to calculate the replacement cost of replacing the equipment 6 # with other equipment, then P1 is the rated power of the equipment 6 #; TY1 is the operating hours of the equipment 6 #; EP is the unit price of electricity; $EER_1$ is the equipment energy efficiency of the equipment 6 #; M1 is the maintenance cost of the equipment 6 #; $EER_3$ is the equipment energy efficiency of the other equipment as the recommended equipment.

Figure 7A:
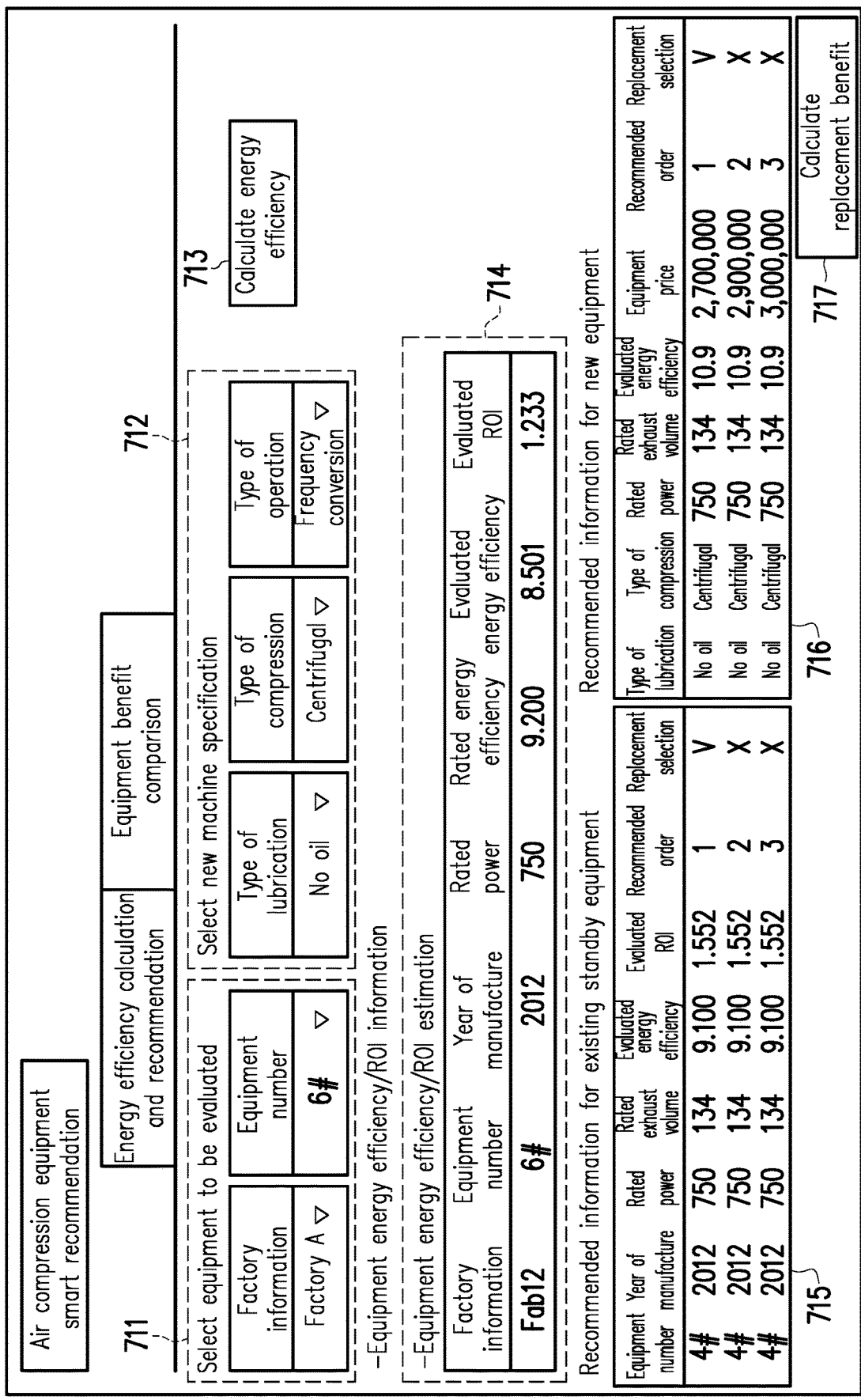
FIG. 7A is a schematic diagram of an operation interface with a recommended equipment list according to an embodiment of the disclosure.

FIG. 7A is a schematic diagram of an operation interface with a recommended equipment list according to an embodiment of the disclosure. Referring to FIG. 7A, the display 110 may display the operation interface 71. The managing personnel may select the equipment to be evaluated for replacement in the interface field 711 of the operation interface 71, and set the equipment specifications of the new equipment in the interface field 712 of the operation interface 71. Here, it is assumed that the managing personnel selects the equipment 6 # in the interface field 711. Afterwards, the managing personnel may click the interface option 713 of the operation interface 71, so that the processor 130 may start to calculate the replacement index and the equipment energy efficiency of the equipment 6 # in the general time interval. The processor 130 may use the statistical value (e.g., the average value or the median) of the aforementioned replacement index in the general time interval as the evaluated replacement index (i.e., the evaluated ROI (return on investment)), and use the aforementioned statistical value (e.g., the average value or the median) of the equipment energy efficiency in the general time interval as the evaluated energy efficiency. Therefore, the interface field 714 of the operation interface 71 may present the evaluated ROI, the evaluated energy efficiency and other equipment information of the equipment 6 #.

In response to the replacement index of equipment 6 # in the abnormal electricity consumption time interval is less than the index threshold value and the equipment energy efficiency of the equipment 6 # in the abnormal electricity consumption time interval is less than the energy efficiency threshold value, the processor 130 may display a recommended equipment list 715 for the equipment 6 # through the display 110. The recommended equipment list 715 may include multiple recommended equipment and their corresponding evaluated ROI and evaluated energy efficiency, and the recommended equipment list 715 may further include a recommended order of the multiple recommended equipment. In addition, the processor 130 may display a recommended equipment list 716 for new equipment through the display 110.

Figure 7B:
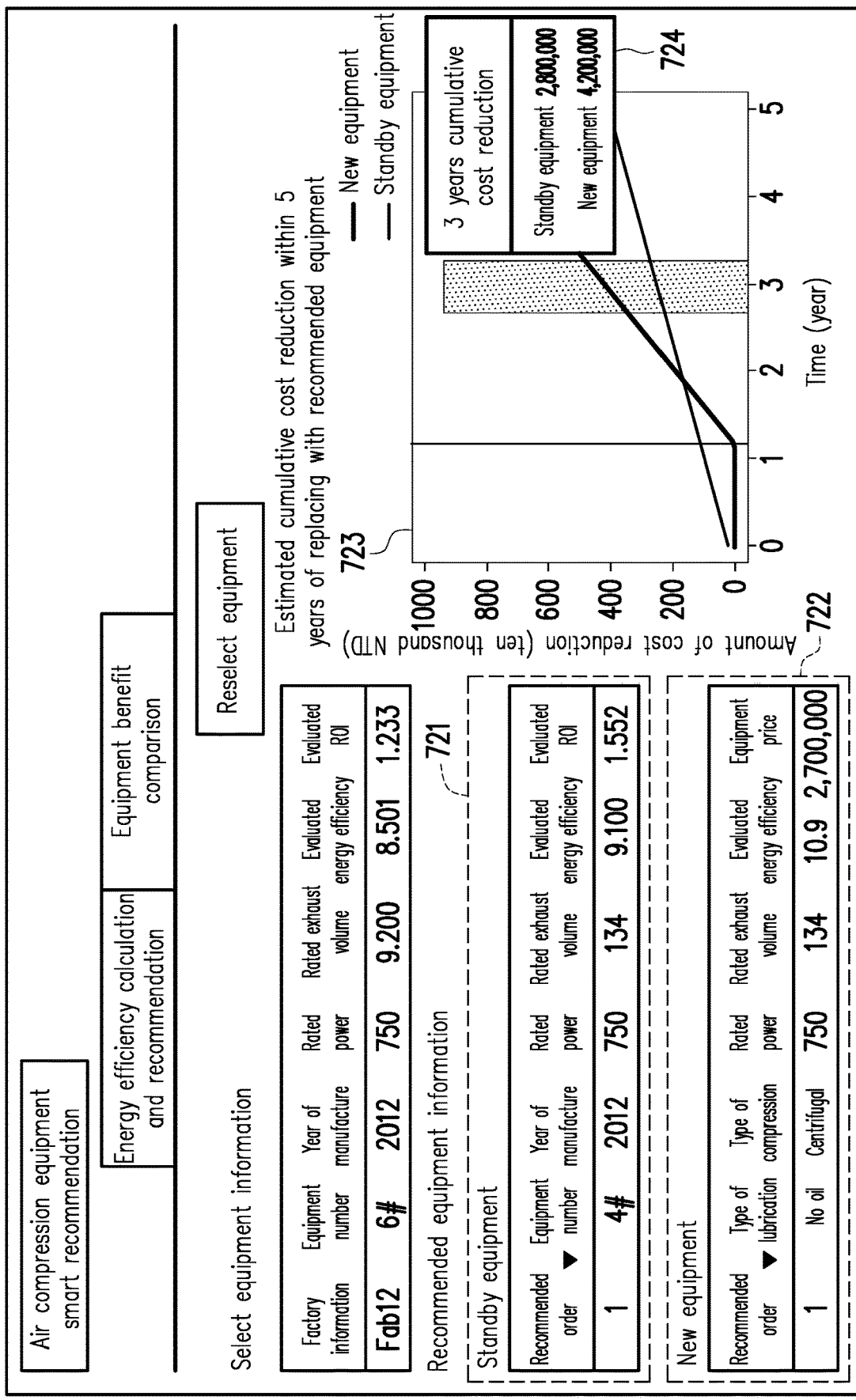
FIG. 7B is a schematic diagram of an operation interface with replacement benefits according to an embodiment of the disclosure.

FIG. 7B is a schematic diagram of an operation interface with replacement benefits according to an embodiment of the disclosure. Assuming that the managing personnel clicks the interface option 717 of the operation interface 71, the display 110 may display the operation interface 72 as shown in FIG. 7B. The managing personnel may select the other equipment 4 # in the recommended equipment list 715 in the interface field 721 of the operation interface 72, and select a new equipment in the recommended equipment list 716 in the interface field 722 of the operation interface 72. Afterwards, the processor 130 calculates the replacement benefit of replacing the equipment 6 # with the equipment 4 # according to Formula (4) and Formula (5), and calculates the replacement benefit of replacing the equipment 6 # with the new equipment according to Formula (2) and Formula (3). The processor 130 may present the aforementioned replacement benefits together on the line graph 723 in the operation interface 72. When the managing personnel clicks on a certain estimated number of years, the display box 724 may directly present the actual value of the replacement benefit for the estimated number of years.

To sum up, in the embodiment of the disclosure, the abnormal electricity consumption time interval may be detected by comparing the actual electricity consumption of the equipment with the reference electricity consumption estimated by the electricity consumption prediction model. Calculating the replacement index and the equipment energy efficiency based on the equipment operation information of the equipment in the abnormal electricity consumption time interval may be used to automatically determine whether the equipment needs to be replaced. In addition, the method of the embodiment of the disclosure may calculate the replacement index and the equipment energy efficiency for a new equipment and other equipment to establish a recommended equipment list, and provide a corresponding recommended equipment list when determining whether an equipment needs to be replaced. Based on this, when the operation of the equipment is abnormal, the factory management may immediately understand whether the equipment needs to be replaced, and may select the appropriate recommended equipment according to the recommended equipment list, so as to conserve electricity and reduce factory costs.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A recommended method for replacing equipment, comprising:
   estimating a plurality of reference electricity consumptions of an equipment by using an electricity consumption prediction model based on equipment operation information of the equipment in a plurality of unit periods;
   obtaining a plurality of actual electricity consumptions of the equipment in the unit periods by an electricity meter;
   determining an abnormal electricity consumption time interval by comparing the actual electricity consumptions with the reference electricity consumptions;
   determining a replacement index and an equipment energy efficiency of the equipment in the abnormal electricity consumption time interval according to the equipment operation information of the equipment in the abnormal electricity consumption time interval; and
   in response to determining that the replacement index and the energy efficiency of the equipment meet a replacement condition, providing a recommended equipment list comprising at least one recommended equipment for replacing the equipment by displaying an operating interface comprising the recommended equipment list through a display,
   wherein determining the abnormal electricity consumption time interval by comparing the actual electricity consumptions with the reference electricity consumptions comprises:
      calculating a plurality of differences between the actual electricity consumptions and the reference electricity consumptions;
      comparing each of the differences with a threshold value to obtain a plurality of comparison results; and
      determining the abnormal electricity consumption time interval of the equipment according to the comparison results.

2. The recommended method for replacing equipment according to claim 1, wherein before estimating the reference electricity consumptions of the equipment by using the electricity consumption prediction model based on the equipment operation information of the equipment in the unit periods, further comprises:
   obtaining a plurality of characteristic variables within a historical period; and
   using the characteristic variables and a historical actual electricity consumption of the equipment in the historical period to train the electricity consumption prediction model based on a machine learning algorithm.

3. The recommended method for replacing equipment according to claim 1, wherein determining the abnormal electricity consumption time interval of the equipment according to the comparison results comprises:
   in response to a number of the differences greater than the threshold value is greater than a preset number within a preset length period, identifying the unit periods corresponding to the differences greater than the threshold value within the preset length period as a first candidate period;
   in response to the differences corresponding to a plurality of consecutive time periods are all greater than the threshold value, identifying the unit periods corresponding to the differences greater than the threshold value as a second candidate time period; and
   determining the abnormal electricity consumption time interval according to the first candidate period and the second candidate period.

4. The recommended method for replacing equipment according to claim 1, wherein determining the replacement index and the equipment energy efficiency of the equipment in the abnormal electricity consumption time interval according to the equipment operation information of the equipment in the abnormal electricity consumption time interval comprises:
   obtaining at least one output data of the equipment within the abnormal electricity consumption time interval; and
   determining the equipment energy efficiency according to a ratio between the at least one output data of the equipment and at least one of the actual electricity consumption corresponding to the abnormal electricity consumption time interval.

5. The recommended method for replacing equipment according to claim 1, wherein determining the replacement index and the equipment energy efficiency of the equipment in the abnormal electricity consumption time interval according to the equipment operation information of the equipment in the abnormal electricity consumption time interval comprises:
   determining a replacement cost according to an operating time of the equipment, the equipment energy efficiency, a maintenance cost of the equipment, and an equipment energy efficiency of a new equipment; and
   determining the replacement index according to a ratio between the replacement cost and an equipment price of the new equipment.

6. The recommended method for replacing equipment according to claim 5, wherein determining the replacement cost according to the operating time of the equipment, the equipment energy efficiency, the maintenance cost of the equipment, and the equipment energy efficiency of the new equipment further comprises:
   determining the replacement cost according to the operating time of the equipment, the equipment energy efficiency, the maintenance cost of the equipment, an operating time of an affected equipment, and other equipment energy efficiency of the affected equipment.

7. The recommended method for replacing equipment according to claim 1, further comprising:
   determining whether the replacement index is less than an index threshold value;
   determining whether the equipment energy efficiency is less than an energy efficiency threshold value; and
   in response to determining that the replacement index is less than the index threshold value and the equipment energy efficiency is less than the energy efficiency threshold value, determining that the replacement index and the equipment energy efficiency meet the replacement condition.

8. The recommended method for replacing equipment according to claim 1, further comprising:
   determining an alternative replacement index and an alternative equipment energy efficiency of the equipment in a general time interval according to the equipment operation information of the equipment;

determining other replacement index and other equipment energy efficiency of at least one other equipment in the general time interval according to equipment operation information of the at least one other equipment; and generating the recommended equipment list according to the alternative replacement index and the alternative equipment energy efficiency in the general time interval and the other replacement index and the other equipment energy efficiency of the at least one other equipment in the general time interval.

9. The recommended method for replacing equipment according to claim 8, wherein generating the recommended equipment list according to the alternative replacement index and the alternative equipment energy efficiency in the general time interval and the other replacement index and the other equipment energy efficiency of the at least one other equipment in the general time interval comprises:

in response to the other replacement index is greater than the alternative replacement index and the other equipment energy efficiency is greater than the alternative equipment energy efficiency, adding the at least one other equipment to the recommended equipment list as the at least one recommended equipment; and determining a recommended order of the at least one recommended equipment according to the other replacement index and the other equipment energy efficiency, wherein the recommended equipment list further comprises a new equipment and a recommended order of the new equipment.

10. An electronic device, comprising:
a display;
a storage circuit, storing a plurality of instructions; and
a processor, coupled to the display and the storage circuit, and accessing the instructions to perform:
estimating a plurality of reference electricity consumptions of an equipment by using an electricity consumption prediction model based on equipment operation information of the equipment in a plurality of unit periods;
obtaining a plurality of actual electricity consumptions of the equipment in the unit periods by an electricity meter;
determining an abnormal electricity consumption time interval by comparing the actual electricity consumptions with the reference electricity consumptions;
determining a replacement index and an equipment energy efficiency of the equipment in the abnormal electricity consumption time interval according to the equipment operation information of the equipment in the abnormal electricity consumption time interval; and
in response to determining that the replacement index and the energy efficiency of the equipment meet a replacement condition, providing a recommended equipment list comprising at least one recommended equipment for replacing the equipment by displaying an operating interface comprising the recommended equipment list through the display,
wherein the processor further performs:
calculating a plurality of differences between the actual electricity consumptions and the reference electricity consumptions;
comparing each of the differences with a threshold value to obtain a plurality of comparison results; and
determining the abnormal electricity consumption time interval of the equipment according to the comparison results.

11. The electronic device according to claim 10, wherein the processor further performs:
obtaining a plurality of characteristic variables within a historical period; and
using the characteristic variables and a historical actual electricity consumption of the equipment in the historical period to train the electricity consumption prediction model.

12. The electronic device according to claim 10, wherein the processor further performs:
in response to a number of the differences greater than the threshold value is greater than a preset number within a preset length period, identifying the unit periods corresponding to the differences greater than the threshold value within the preset length period as a first candidate period;
in response to the differences corresponding to a plurality of consecutive time periods are all greater than the threshold value, identifying the unit periods corresponding to the differences greater than the threshold value as a second candidate time period; and
determining the abnormal electricity consumption time interval according to the first candidate period and the second candidate period.

13. The electronic device according to claim 10, wherein the processor further performs:
obtaining at least one output data of the equipment within the abnormal electricity consumption time interval; and
determining the equipment energy efficiency according to a ratio between the at least one output data of the equipment and at least one of the actual electricity consumption corresponding to the abnormal electricity consumption time interval.

14. The electronic device according to claim 10, wherein the processor further performs:
determining a replacement cost according to an operating time of the equipment, the equipment energy efficiency, a maintenance cost of the equipment, and an equipment energy efficiency of a new equipment; and
determining the replacement index according to a ratio between the replacement cost and an equipment price of the new equipment.

15. The electronic device according to claim 14, wherein the processor further performs:
determining the replacement cost according to the operating time of the equipment, the equipment energy efficiency, the maintenance cost of the equipment, an operating time of an affected equipment, and other equipment energy efficiency of the affected equipment.

16. The electronic device according to claim 10, wherein the processor further performs:
determining whether the replacement index is less than an index threshold value;
determining whether the equipment energy efficiency is less than an energy efficiency threshold value; and
in response to determining that the replacement index is less than the index threshold value and the equipment energy efficiency is less than the energy efficiency threshold value, determining that the replacement index and the equipment energy efficiency meet the replacement condition.

17. The electronic device according to claim 10, wherein the processor further performs:
- determining an alternative replacement index and an alternative equipment energy efficiency of the equipment in a general time interval according to the equipment operation information of the equipment;
- determining other replacement index and other equipment energy efficiency of at least one other equipment in the general time interval according to equipment operation information of the at least one other equipment; and
- generating the recommended equipment list according to the alternative replacement index and the alternative equipment energy efficiency in the general time interval and the other replacement index and the other equipment energy efficiency of the at least one other equipment in the general time interval.

18. The electronic device according to claim 17, wherein the processor further performs:
- in response to the other replacement index is greater than the alternative replacement index and the other equipment energy efficiency is greater than the alternative equipment energy efficiency, adding the at least one other equipment to the recommended equipment list as the at least one recommended equipment; and
- determining a recommended order of the at least one recommended equipment according to the other replacement index and the other equipment energy efficiency,
- wherein the recommended equipment list further comprises a new equipment and a recommended order of the new equipment.

* * * * *